United States Patent [19]

Chiba

[11] Patent Number: 5,043,910
[45] Date of Patent: Aug. 27, 1991

[54] PRINTED CIRCUIT BOARD FUNCTION TESTING SYSTEM

[75] Inventor: Takamasa Chiba, Kanagawa, Japan

[73] Assignee: Graphtec Kabushikikaisha, Tokyo, Japan

[21] Appl. No.: 427,241

[22] Filed: Oct. 25, 1989

Related U.S. Application Data

[63] Continuation-in-part of Ser. No. 112,627, Oct. 22, 1987, abandoned, which is a continuation-in-part of Ser. No. 849,782, Apr. 9, 1986, abandoned.

[51] Int. Cl.⁵ .................. G06F 11/00; G01R 31/28
[52] U.S. Cl. .................. 364/489; 364/488; 364/551.01; 371/.. .; 371/22.1
[58] Field of Search ........... 364/550, 551.01, 488–491; 324/73 PC; 371/20, 25, 22.1, 25.1

[56] References Cited

U.S. PATENT DOCUMENTS

| 4,493,045 | 1/1985 | Hughes, Jr. | 364/488 |
| 4,510,572 | 4/1985 | Reece et al. | 364/489 |
| 4,686,627 | 8/1987 | Donovan et al. | 364/489 |
| 4,686,628 | 8/1987 | Lee et al. | 364/481 |
| 4,691,287 | 9/1987 | Suzuki et al. | 364/490 |

Primary Examiner—Parshotam S. Lall
Assistant Examiner—Brian M. Mattson
Attorney, Agent, or Firm—Harness, Dickey & Pierce

[57] ABSTRACT

A printed circuit board function testing system compares permissible range data to a waveform signal obtained from a given measuring point of a non-defective circuit board in actual operation and a waveform signal obtained from a corresponding given measuring point of a test circuit board in actual operation to judge whether the test circuit board is defective or not.

10 Claims, 5 Drawing Sheets

PRINTED CIRCUIT BOARD FUNCTION TESTING SYSTEM

This is a continuation-in-part patent application of copending U.S. patent application Ser. No. 112,627, filed on Oct. 22, 1987, which is a continuation-in-part patent application of U.S. patent Ser. No. 849,782, filed on Apr. 9, 1986, both abandoned.

BACKGROUND OF THE INVENTION

1. Technical Field

This invention relates to a function testing system for determining whether a printed circuit board having electronic parts is defective or not.

2. Background Information

According to conventional function testing systems for printed boards, a signal is applied to an input terminal of a circuit board being tested and a value of a resulting signal appearing at an output terminal of the circuit board is measured by means of a digital voltmeter, oscilloscope or other measuring instrument. The operation of the circuit board is then compared with an operational simulation of the circuit board, which is based on the design drawing, to determine whether the circuit board is defective. To automate this type of function testing system, it is necessary to characterize the operational simulation in software and store the software in a computer. However, such a system is quite complicated. Thus, a need exists for a simplified function testing system.

A number of systems disclosed in the art have specific operational problems which render the systems unsatisfactory. According to the system disclosed in U.S. Pat. No. 4,510,572, the signature of a digital circuit previously confirmed as being non-defective is stored in a memory. This signature is compared with the signature of a test digital circuit to determine whether the test digital circuit is defective. Since the system utilizes the signature in digital form as its comparison parameter for testing, the system is inapplicable to testing circuit boards providing an analog signal. Although it is possible to convert the analog signal into a digital signal using an A/D converter or the like, if the analog signal from the circuit board has even small fluctuations falling within a reasonable range, the digital signal obtained by conversion will have large fluctuations. This will produce an erroneous indication that the circuit is defective when it is not. Thus, the system of this patent is inferior because it can only accurately test digital circuits.

Other systems generally called in-circuit testers are disclosed in U.S. Pat. Nos. 4,686,627 and 4,688,628. With an in-circuit tester, every electronic part mounted on a circuit board is tested, and then the circuit board is judged by synthesizing the individual test results of each electronic part. Therefore, a large number of points on the circuit board must be laboriously measured in a time consuming manner.

Further systems, as disclosed in U.S. Pat. Nos. 4,493,045 and 4,652,814, are intended to solve the foregoing problems of the in-circuit tester. The systems generate test vectors to effectively shorten the measurement time. However, such systems have proven to be unsatisfactory.

SUMMARY OF THE INVENTION

It is an object of the present invention to provide a function testing system which is capable of determining whether a circuit board is defective using a comparatively simple apparatus without the need for a measuring instrument, such as a digital voltmeter or oscilloscope, and without the need for previously storing the operational simulation of the circuit board in a computer in the form of software.

It is another object of the present invention to provide a function testing system which is capable of reliable testing by obtaining a waveform signal from a circuit board being tested over time rather than instantaneously and comparing it to a waveform signal obtained from a non-defective circuit board.

It is still another object of the present invention to provide a function testing system which is capable of reliably testing whether a circuit board is defective without being influenced by normal fluctuations in a signal from the circuit board being tested, by setting a permissible range based on a waveform signal obtained from a comparative non-defective circuit board.

To achieve the foregoing objects, the present invention provides a function testing system for testing circuit boards. The system comprises a waveform signal obtaining means for obtaining an output signal over a period of time from a given point being measured on a non-defective circuit board having electronic parts mounted thereon and wired thereto. The non-defective circuit board has been confirmed to be non-defective and is maintained under the same conditions as when it is mounted in an actual operational device. The system further comprises a means for creating permissible range data, which serve as a permissible range for tests based on the waveform signals; a means for retrievably storing the permissible range data; and a waveform signal obtaining means for obtaining an output signal in the form of a test waveform signal over a period of time from a given point being measured on a test circuit board being tested which has electronic parts mounted thereon and wired thereto. The test circuit board is maintained under the same conditions as when it is mounted in the actual operational device. The system additionally comprises a means for comparing and determining whether the test waveform signal falls within the permissible range of the permissible range data and a means for notifying a user of the test results.

As will be appreciated from the foregoing description, the present invention obtains the output signal at a given point being measured on a non-defective circuit board and stores the permissible range data defining the permissible range. Therefore, even when there are several circuit boards to be tested, these circuit boards can be rapidly tested using this comparatively simple system. Since even a complicated electric circuit generally can be divided into several sub-circuit blocks in terms of function, the number of measuring points, from which each waveform signal is obtained, can be decreased by allocating at least one measuring point to each sub-circuit block. Further, according to the present invention, the signal obtained from a given measuring point of the non-defective circuit board and from that of the test circuit board is not an instantaneous signal, but a waveform signal spread over a given period of time. Thus, a high degree of accuracy can be ensured by the present test.

DETAILED DESCRIPTION OF A PREFERRED EMBODIMENT

Figure 1:
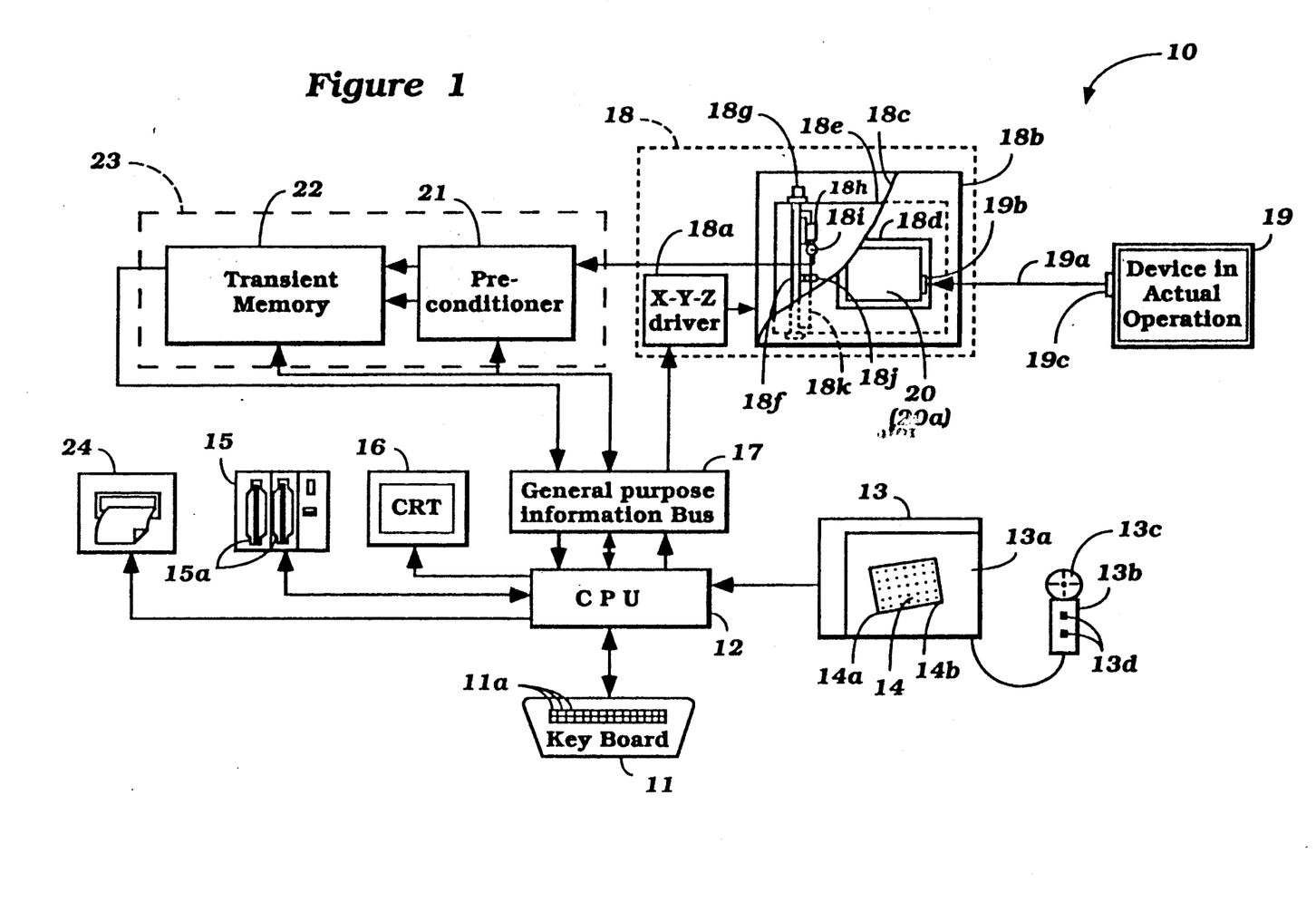
FIG. 1 is a general structural diagram of a function testing system which is an embodiment of the present invention.

A general structure of an embodiment of the present invention will now be described with reference to FIG. 1. In FIG. 1, a function testing system is designated by reference numeral 10. A keyboard 11 includes keyswitches 11a and is used to set predetermined commands, parameters, etc. A CPU or central processing unit 12 (hereinafter referred to as a "processor") connected to the keyboard 11 receives the commands, parameters, etc., and controls the function testing system 10.

A measuring point detecting means 13 connected with the processor 12 obtains the coordinate values of given measuring points of a non-defective circuit board and of a test circuit board. This measuring point detecting means 13 is made of a so-called tablet which comprises a coordinate plate 13a and a position indicator 13b. Either a measuring point designating diagram sheet 14, on which given measuring points of the non-defective circuit board or test circuit board are marked, or a fresh circuit board with no electronic parts mounted thereon, is placed on the coordinate reading plate 13a, and then a center collimation point 13c of the position indicator 13b is positioned at a given point of the measuring point designating diagram sheet 14 or the fresh circuit board. By turning on a switch 13d of the position indicator 13b, the coordinate values of a given measuring point are entered into the processor 12. In this case, even when the measuring point designating diagram sheet 14 or the like is placed in an inclined position, such an inclination can be compensated for by designating left and right lower end portions 14a and 14b of the sheet by means of the position indicator 13b.

An external memory unit 15 connected with the processor 12 is adapted to successively store in its flexible disk 15a the coordinate values of the given measuring points of the non-defective circuit board or test circuit board that are obtained through the measuring point detecting means 13. A display means 16 displays the course of processing the result of a good/bad test of the test circuit board under the control of the processor 12. A bus unit 17 acts as an output/input interface of the processor 12.

A waveform obtaining means 18 comprises an X-Y-Z driver 18a being controlled under the instruction of the processor 12, an X-Y-Z table 18b being likewise controlled, an upper plate 18c of this table 18b, a positioning frame 18d provided on the upper plate 18c to which the non-defective circuit board 20a or the test circuit board 20b is attached, a guide plate 18e, a Y-axis lever 18f movable along this guide plate 18e in the direction of the X-axis, an X-axis motor 18g for moving this Y-axis lever 18f in the direction of the X-axis, a Y-axis motor 18h for moving a slide member movable along the Y-axis lever in the direction of the Y-axis, a probe 18i attached to this slide member, which upon movement in the direction of the Z-axis, comes to touch a given measuring point of the non-defective circuit board 20a or the test circuit board 20b to obtain a waveform signal and send it to a waveform converting/storing means of a subsequent stage, a Z-axis motor 18j for moving the probe 18i in the direction of the Z-axis, and a link lever 18k for converting the driving force of the Z-axis motor 18j into a Z-axis moving force for the probe 18i.

The non-defective circuit board 20a or the test circuit board 20b, from which a waveform signal is to be obtained, is attached to the positioning frame 18d of the X-Y-Z table 18b. Then, the so attached non-defective circuit board 20a or test circuit board 20b is connected to an actual operational device 19 via connectors 19b and 19c, so that it is put in actual operation. In this state, the X-Y-Z driver 18a moves to an object measuring point in accordance with the instruction from the processor 12, i.e. the instruction for movement to the coordinates of a given measuring point detected by the measuring point detecting means 13. This movement is attained by the driving of the X-axis motor 18g and the Y-axis motor 18h. At the moment when the object measuring point has been reached, the processor 12 further controls the Z-axis motor 18j to drive the probe 18i in the direction of the Z-axis such that the probe comes to touch the measuring point on the back side of the non-defective circuit board 20a or test circuit board 20b, whereby the waveform signal at that measuring point can be obtained. This waveform signal is sent to the waveform converting/storing means of the subsequent stage.

Figures 2, 3:
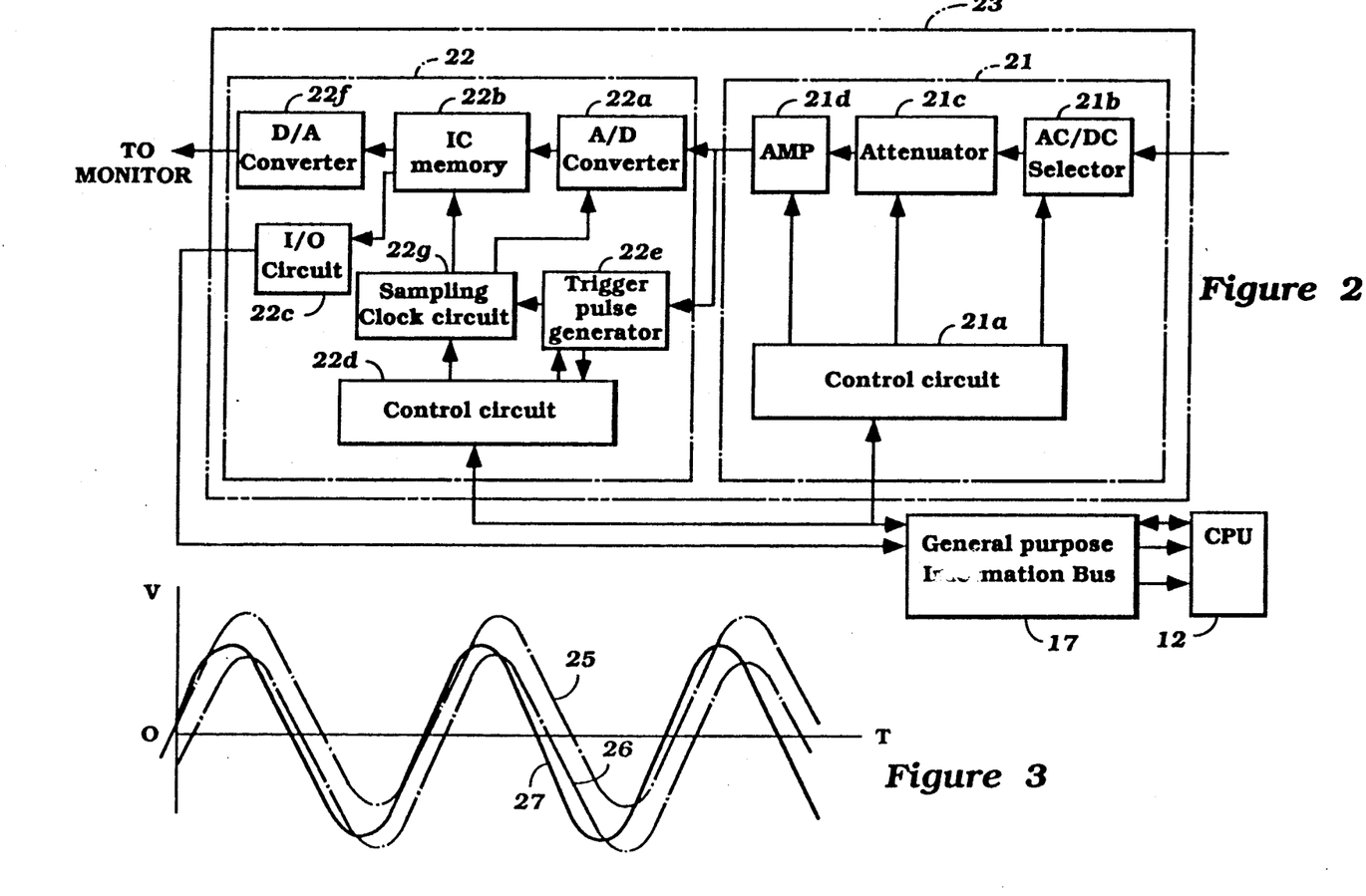
FIG. 2 is a circuit block diagram of a waveform converting/storing means.
FIG. 3 is a chart showing permissible range data and test waveform signals.

The waveform converting/storing means 23 comprises a pre-conditioner 21 and a transient memory 22. As shown in FIG. 2, the pre-conditioner 21 comprises a control circuit 21a, an AC/DC (alternating current/direct current) selector 21b, an attenuator 21c, and an amplifier 21d. The transient memory 22 comprises an A/D (analog/digital) converter 22a, an IC (integrated circuit) memory 22b, an I/O (input/output) circuit 22c, a control circuit 22d, a trigger pulse generator 22e, and a sampling clock circuit 22g.

The waveform signal from the waveform obtaining means 18 described above is processed by the AC/DC selector 21b of the pre-conditioner 21 so that an AC component or a DC component is selected. This selection is attained by the control circuit 21a in accordance with the instruction from the processor 12. The output signal of the AC/DC selector 21b is sent to the attenuator 21c so that its voltage level is regulated. After being amplified by the amplifier 21d to a given level, the signal is sent to the transient memory 22. In the transient memory 22, the output signal of the preconditioner 21 is sent to the A/D converter 22a and the trigger pulse generator 22e. Here, if an input waveform signal to the transient memory 22 belongs to the non-defective circuit board 20a, the following processing is included.

The processor 12 causes the interface 17 and the control circuit 22d of the transient memory 22 to successively convert the input waveform signal from the non-defective circuit board 20a into a digital signal at an adequate sampling clock, and controls the A/D converter 22a and the IC memory 22b. Then, the processor 12 causes the I/O circuit 22c to read out waveform data stored in the IC memory 22b and causes the display means 16 to display the waveform data. While observing the so displayed continuous waveform, the user of the system specifies an important portion of the waveform signal at a given measuring point of the non-defective circuit board 20a to perform the good/bad test on the test circuit board and enters a threshold value through the keyboard 11 into the processor 12, which serves as a measurement starting point so that only a necessary waveform signal at a given measuring point of the test circuit board 20b can be obtained.

Upon receipt of the threshold value, the processor 12 controls the trigger pulse generator 22e and the sampling clock circuit 22g via the control circuit 22d so that only a necessary waveform signal at the measuring point of the non-defective circuit board can be stored in the IC memory 22b of the transient memory 22. Accordingly, when the output signal of the pre-conditioner 21, i.e. the waveform signal at the given measuring point of the non-defective circuit board 20a, exceeds the foregoing threshold value, the trigger pulse generator 22e generates a trigger pulse. This trigger pulse is sent to the sampling clock circuit 22g. The sampling clock circuit 22g delivers an operation clock to the A/D converter 22a and the IC memory 22b. Here, the interval of generation of the sampling clock of the sampling clock circuit 22g is determined by the memory capacity of the IC memory 22b and the period of the sampling clock. In this way, the waveform signal of the non-defective circuit board 20a is converted into a digital signal while the sampling clock is being generated by the A/D converter 22a of the transient memory 22 and stored in the IC memory 22b.

Where the waveform signal entered into the transient memory 22 is from the given measuring point of the test circuit board, only a waveform signal exceeding the threshold value (i.e. a waveform signal corresponding to that obtained from the non-defective circuit board 20a) is successively converted into a digital signal and stored in the IC memory 22b.

Where the waveform signal stored in the IC memory 22b of the waveform converting/storing means 23 belongs to the non-defective circuit board 20a, the following processing is additionally performed.

The waveform signal stored in the IC memory 22b is sent through the I/O circuit 22c and the interface 17, temporarily stored in the first memory (not shown) of the processor 12, and displayed in the form of a continuous waveform by the display means 16 connected with the processor 12. While observing the continuous waveform displayed by the display means 16, the user of the system enters through the keyboard 11 parameters for creation of the permissible range data including upper and lower limits which define a permissible range being used in judging the output waveform of the test circuit board 20b. Upon acceptance of these parameters, the processor 12 calculates the upper and lower limit values of each digital waveform data point stored in the first memory, these limit values being stored in the flexible disk 15a of the external memory unit 15 as the permissible range data.

The processor 12 is utilized as a comparing/judging means for testing whether the test circuit board 20b is good or bad. The waveform output signal of the test circuit board 20b obtained by the waveform obtaining means 18 is stored in the IC memory 22b of the transient memory 22 of the waveform converting/storing means in response to the foregoing sampling interval. The processor 12 reads out the permissible range data stored in the external memory unit 15 and stores it in the first memory and reads out the test data of the test circuit board 20b store in the IC memory (not shown). The processor 12 processes in a predetermined manner the permissible range data and the test data stored in the first memory and the second memory and displays them in the form of a continuous waveform by the display means 16. The mode of display is as shown in FIG. 3. Another mode of display is disclosed in British Patent Application No. 2038062A, which may be adopted herein. Two waveforms 25 and 26 shown by onedot chain lines in FIG. 3 are the upper and lower limit lines, respectively, of the permissible range data, and a waveform 27 shown by a solid line is illustrative of the test data. Then, with respect to each sample value of the test data stored in the second memory, the processor 12 reads out the upper and lower limit values, corresponding to each sample value, of the permissible range data stored in the first memory and makes a calculation to judge whether the sample value of the test data falls within the permissible range defined by the upper and lower limit values of the permissible range data. On the basis of the result of the foregoing calculation, the processor 12 makes a good/bad judgement and causes the display means 16 to display either "good circuit board" or "bad circuit board" and a printer 24 to print detailed test results.

The operation of the present invention will be described with reference to FIGS. 4, 5 and 6.

Figure 4:
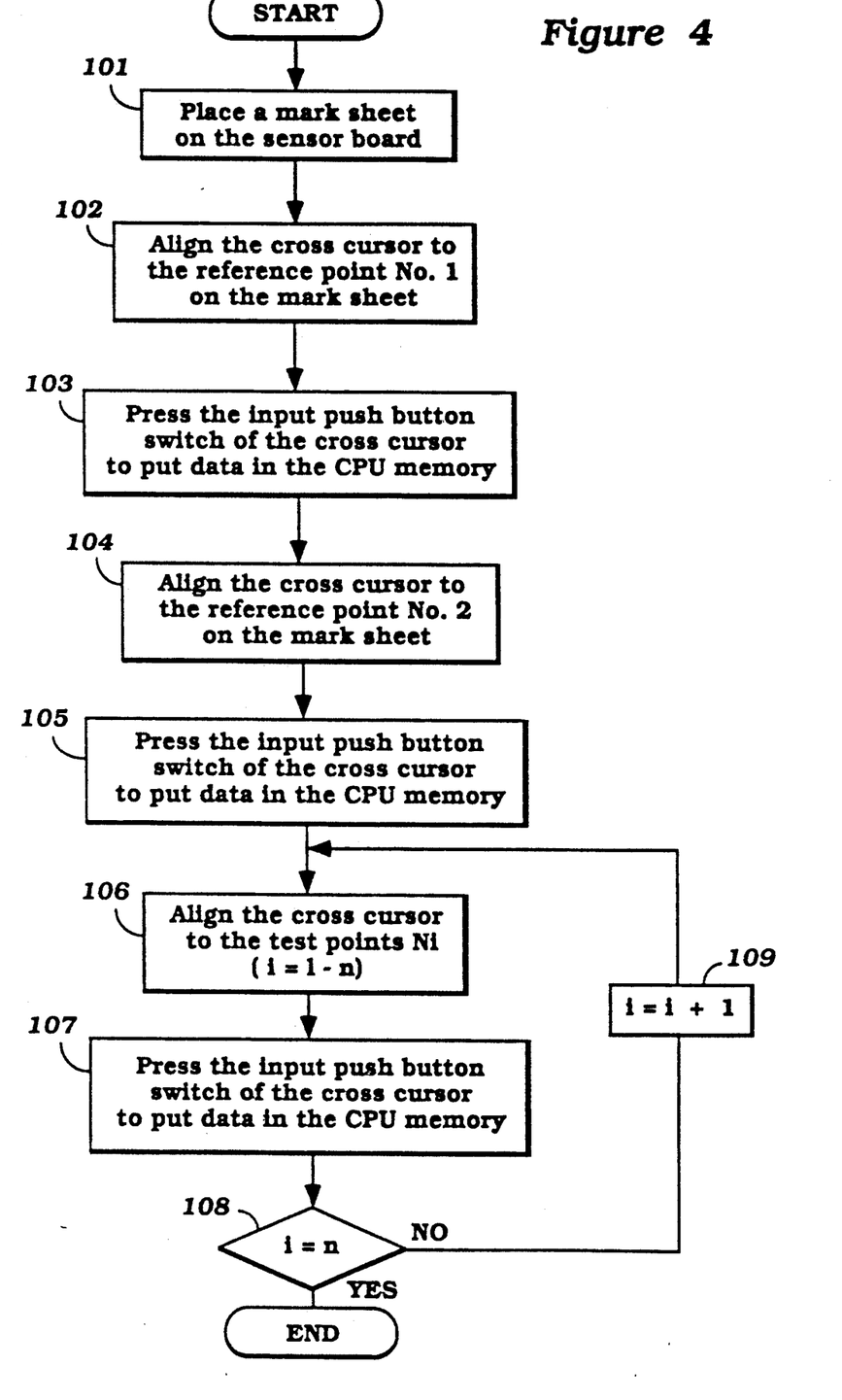
FIG. 4 is a flowchart showing the process of determining the coordinate values of given points to be measured on a non-defective circuit board and a test circuit board, and the sequence of measurement of these points.

FIG. 4 is a flowchart showing the process of detecting coordinate signals that is performed by the measuring point detecting means 13 shown in FIG. 1.

In step 101, the measuring point designating diagram sheet 14 is placed on the coordinate reading plate 13a. In step 102, the center collimation point 13c of the position indicator 13b is positioned at a first measuring point marked on the measuring point designating diagram sheet 14. In step 103, the switch 13d of the position indicator 13b is turned-on to store the X/Y coordinate data of the first measuring point through the processor 12 in the external memory unit 15. In step 104, the center collimation point 13c of the position indicator 13b is positioned at a second measuring point. In step 105, the switch 13d of the position indicator 13b is turned-on to store the X/Y coordinate data of the second measuring point in the external memory unit 15.

The foregoing procedures are repeated to successively store the X/Y coordinate data of the individual measuring points in the external memory unit 15. That is, in step 106, the center collimation point 13c of the position indicator 13b is positioned at an i-th measuring point. In step 107, the switch 13d of the position indicator 13b is turned-on store the X/Y coordinate data of the i-th measuring point in the external memory unit 15. In step 108, whether the X/Y coordinate data of the final measuring point has been stored is judged in the external memory unit 15. If the final measuring point has not yet been completed, in step 109, incrementally increase the ranking of the measuring point by one, and return control to step 106.

If it is confirmed in step 108 that the X/Y coordinate data of the final measuring point has been stored in the external memory unit 15, the result is that the X/Y coordinate data of a plurality of given measuring points of the non-defective circuit board 20a and of the test circuit board 20b and their sequence of measurement have been completely stored in the external memory unit 15 by means of the measuring point detecting means 13, and control comes to an end.

Figure 5:
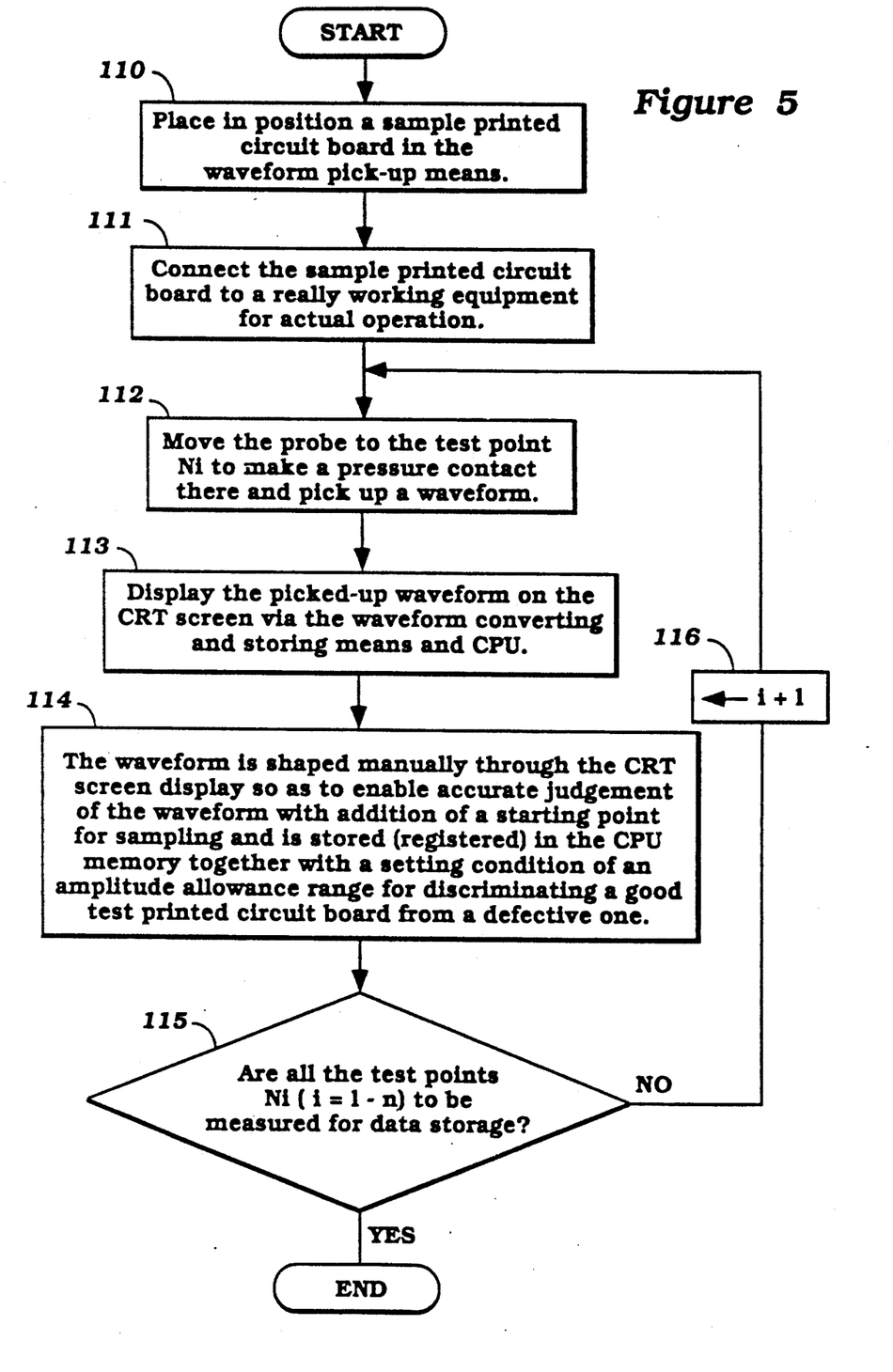
FIG. 5 is a flowchart showing the process of obtaining waveform signals at given measuring points on the non-defective circuit board, and creating permissible range data.

FIG. 5 shows a next process subsequent to the process of obtaining the position information of the measuring points of the circuit board as shown in FIG. 4, i.e. the process of obtaining the waveform signal at each given measuring point of the non-defective circuit board 20a and creating the permissible range data on the basis of such waveform data.

In step 110, the non-defective circuit board 20a is attached to the waveform obtaining means 18. In step 111, the non-defective circuit board 20a is connected to the actual operational device 19 and put it in operation. In step 112, the measuring point information is read out, i.e. the i-th coordinate data among the X/Y coordinate data, obtained through the process of FIG. 4, the probe 18i of the waveform obtaining means 18 is positioned at that X/Y coordinate point, it is raised in the direction of the Z-axis, it is connected to the i-th measuring point on the back side of the non-defective circuit board 20a, and the waveform signal is sent at that point to the waveform converting/storing means 23 of the subsequent stage.

In step 113, the waveform signal of the non-defective circuit board 20a is converted by means of the waveform converting/storing means 23 under the control of the processor 12 at adequate sampling intervals into a digital signal, and it is displayed by the display means 16 in the form of a continuous waveform. In step 114, a trigger level and a sampling interval is manually set on the basis of the continuous waveform thus displayed for the purpose of obtaining only a waveform signal necessary for good/bad testing of the circuit board, and enter parameters, necessary for creation of the permissible range data, into the processor 12 on the basis of the waveform signal obtained using the trigger level and sampling interval from the non-defective circuit board 20a. Then, the permissible range data is stored relating to the measuring point at this moment that is created by the processor 12 in the external memory means 15. Steps 112, 113 and 114 are performed successively from the first measuring point in accordance with the measuring point information of the circuit board obtained through the process of FIG. 4.

In step 115, whether the foregoing series of steps has processed the final measuring point is judged. If the final measuring point has not yet been processed, in step 116, the ranking of the measuring point is incremented by one, and control to step 112 is returned. If it is confirmed in step 115 that the final measuring point has been processed, the result is that all the waveform signals of the non-defective circuit board 20a have been obtained and all of the permissible range data has been created on the basis of these waveform signals, and control comes to an end.

Figure 6:
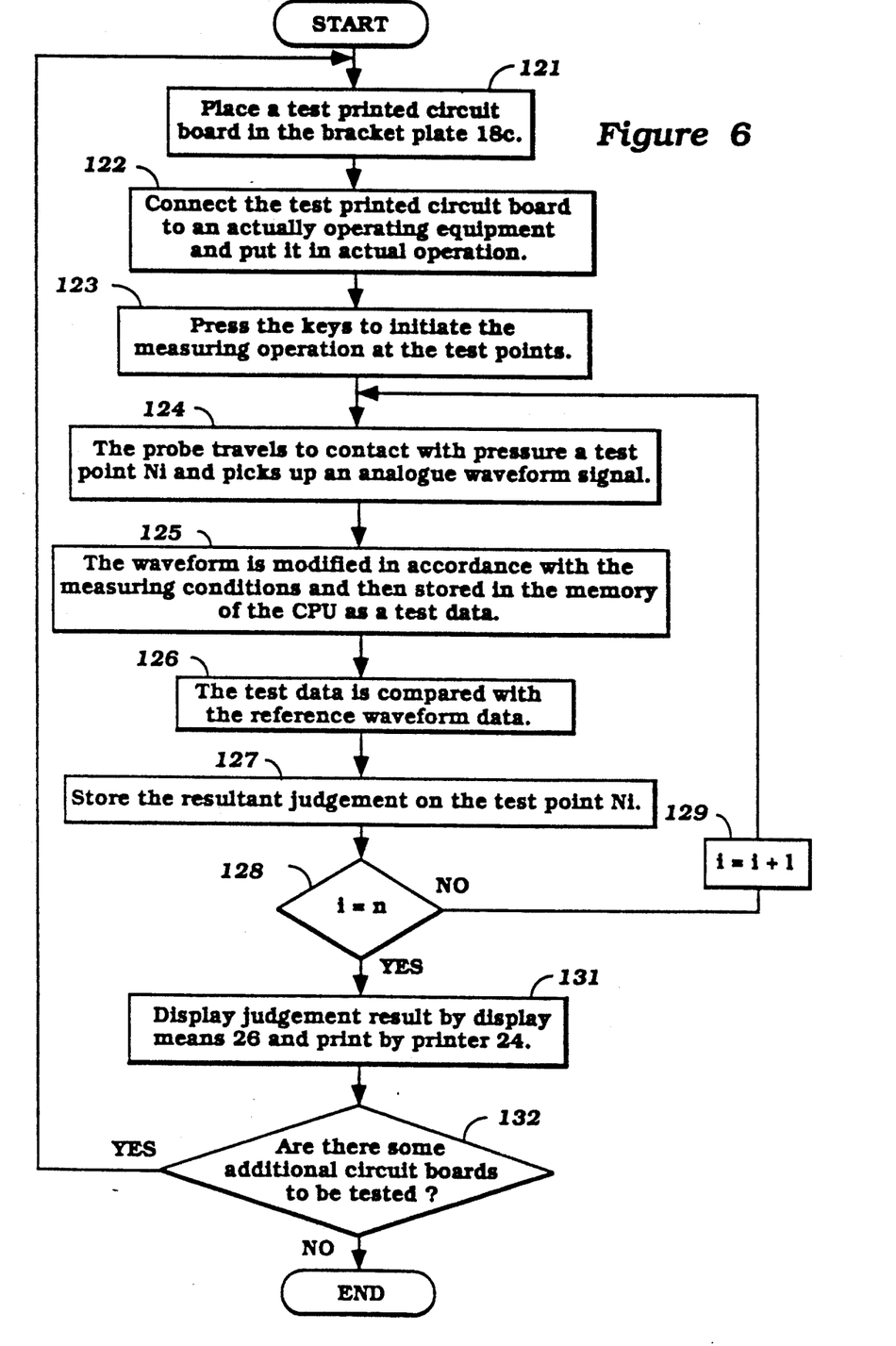
FIG. 6 is a flowchart showing the process of obtaining waveform signals at given measuring points on the test circuit board, and comparing them with the permissible range data.

Referring to FIG. 6, the process of obtaining the waveform signals of the test circuit board 20b and comparing these test waveform signals with the permissible range data obtained through the process of FIG. 5 will be described, this being subsequent to the process of FIG. 5.

In step 121, the test circuit board 20b (to be subjected to the good/bad test) is attached to the waveform obtaining means 18. In step 122, the test circuit board 20b is connected to the actual operational device 19 and put it in operation. In step 123, the system is instructed to start testing of the test circuit board 20b. In step 124, the probe 18i of the waveform obtaining means 18 is positioned at a given measuring point i, it is raised in the direction of the Z-axis, the test waveform signal is obtained at that measuring point, and it is sent to the waveform converting/storing means 23 of the subsequent stage.

In step 125, after regulating the voltage level and the like of the test waveform signal, the test waveform signal, exceeding the trigger level set in the first half of step 114 of FIG. 5, is converted at given sampling intervals and over a given duration into a digital signal, and it is stored. In step 126, the test waveform signal in digital form is compared with the permissible range data created in step 114 of FIG. 5. In step 127, the result of the comparison, relating to a given measuring point i obtained in step 126, is stored in the external memory unit 15 under the control of the processor 12. In step 128, whether all the measuring points have undergone the foregoing process steps is determined.

If all points have not yet been processed, in step 129, the ranking of the measuring point is incrementally increased by one, and control is returned to step 124. If it is confirmed in step 128 that all the measuring points have been subjected to the comparison process steps, control to step 130 is advanced. In step 130, whether the test circuit board is defective is determined by synthesizing the comparison results of all of the measuring points by means of the processor 12. In step 131, the result of the test is displayed by the display means 16 and print it by the printer 24.

Although at this step the comparison and judgment of one test circuit board 20b has been completed, for the case where a plurality of test circuit boards 20b are to be tested successively, step 132 is proceeded to wherein the display means 16 displays a message asking for the presence or absence of additional circuit boards 20b to be tested. If the testing of additional circuit boards 20b is selected, control returns to step 121. If there are no additional circuit boards 20b to be tested, the system terminates processing.

What is claimed is:

1. A function testing system for comparing an output signal at a plurality of given measuring points of a non-defective circuit board with an output signal at each corresponding given measuring point of a plurality of measuring points of a test circuit board, thereby providing a test for determining whether the test circuit board is defective, comprising:

(a) measuring point detecting means for supporting and specifying location data of the given measuring points of the non-defective circuit board and the test circuit board;

(b) waveform obtaining means having a signal pickup probe for contacting the given measuring points of the non-defective circuit board and the test circuit board based on the location data obtained by the measuring point detecting means and obtaining the output signals at the given measuring points of the non-defective circuit board and the test circuit board, the output signals of the non-defective and test circuit boards resulting from input signals applied to the respective circuit boards;

(c) waveform converting/storing means connected to said waveform obtaining means for converting the output signals of the non-defective circuit board and the test circuit board obtained by the waveform obtaining means at given sampling intervals and over a given duration into test waveform data in digital form and for storing the test waveform data;

(d) permissible range data creating means, connected to said waveform converting/storing means for creating permissible range data; and (e) comparing/judging means, connected to said waveform converting/storing means for comparing the permissible range data with the test waveform data.

2. The function testing system of claim 1 wherein the location data is an X/Y coordinate data form.

3. The function testing system of claim 2 wherein the signal pickup probe of the waveform obtaining means is capable of moving to and touching the given measuring points of the non-defective circuit board and the test circuit board on an X-Y-Z table.

4. The function testing system of claim 3 wherein the waveform obtaining means has a drive means for driving the signal pickup probe in X-, Y-, and Z- axes directions of the table based upon X/Y coordinate data obtained by the measuring point detecting means.

5. The function testing system of claim 2 wherein the waveform obtaining means is attachable to the non-defective circuit board and to the test circuit board.

6. The function testing system of claim 1 further comprising means for providing input signals connected to said test and said non-defective circuit boards and wherein the input signals applied to the non-defective circuit board and the test circuit board are same as those applied when the circuit boards are mounted in an actual operational machine.

7. The function testing system of claim 1 wherein storage of the test waveform data in the waveform converting/storing means is temporary.

8. The function testing system of claim 1 wherein the permissible range data include upper and lower limit values.

9. The function testing system of claim 1 wherein the permissible range data creating means stores the permissible range data.

10. A function testing system for comparing an output signal at a plurality of given measuring points of a non-defective circuit board with an output signal at each corresponding given measuring point of a plurality of measuring points of a test circuit board, thereby providing a test for determining whether the circuit board is defective, comprising:

(a) measuring point detecting means for supporting and obtaining X/Y coordinate data of the given measuring points of the non-defective circuit board and the test circuit board;

(b) waveform obtaining means, which is attachable to the non-defective circuit board and to the test circuit board and which includes an X-Y-Z table having a signal pickup probe for moving to and touching the given measuring points of the non-defective circuit board and the test circuit board, the waveform obtaining means having a drive means for driving the signal pickup probe in X-Y-Z axes directions of the table based upon the X/Y coordinate data obtained by the measuring point detecting means to obtain the output signal at the given measuring points of the non-defective circuit board and the test circuit board, wherein an input signal applied to the non-defective circuit board and the test circuit board is same as that applied when the circuit board is mounted in an actual operational machine;

(c) waveform converting/storing means connected to said waveform converting/storing means for converting the output signals of the non-defective circuit board and the test circuit board obtained by the waveform obtaining means at given sampling intervals and over a given duration into test waveform data in digital form and temporarily storing the waveform data;

(d) permissible range data creating means connected to said waveform obtaining means for creating permissible range data including upper and lower limit values for the test based on the waveform data of the non-defective circuit board and storing the permissible range data; and, (e) comparing/judging means connected to said waveform obtaining means for comparing the permissible range data with the test waveform data.

* * * * *